(12) United States Patent
Ueda

(10) Patent No.: US 7,791,930 B2
(45) Date of Patent: Sep. 7, 2010

(54) MAGNETORESISTIVE RANDOM ACCESS MEMORY

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 12/164,410

(22) Filed: Jun. 30, 2008

(65) Prior Publication Data
US 2009/0010045 A1    Jan. 8, 2009

(30) Foreign Application Priority Data
Jul. 3, 2007   (JP) .............................. 2007-175564

(51) Int. Cl.
G11C 11/00  (2006.01)
G11C 5/08   (2006.01)
G11C 11/14  (2006.01)

(52) U.S. Cl. ..................... 365/158; 365/148; 365/210.1

(58) Field of Classification Search ........................ None
See application file for complete search history.

(56) References Cited

U.S. PATENT DOCUMENTS

| | | | |
|---|---|---|---|
| 5,608,676 A * | 3/1997 | Medlock et al. ........ | 365/189.09 |
| 6,496,436 B2 | 12/2002 | Naji | |
| 6,700,814 B1 * | 3/2004 | Nahas et al. ................. | 365/158 |
| 6,944,048 B2 * | 9/2005 | Iwata .......................... | 365/158 |
| 2007/0121391 A1 * | 5/2007 | Gogl et al. ............. | 365/189.09 |
| 2007/0247892 A1 * | 10/2007 | Egerer ......................... | 365/148 |

* cited by examiner

*Primary Examiner*—Amir Zarabian
*Assistant Examiner*—James G Norman
(74) *Attorney, Agent, or Firm*—Oblon, Spivak, McClelland, Maier & Neustadt, L.L.P.

(57) ABSTRACT

A MRAM includes a first magnetoresistive effect (MR) element that takes a low and high resistance states. A second MR element is fixed to a low or high resistance state. First and second MOSFETs are connected to the first and second MR elements, respectively. A sense amplifier amplifies a difference between values of current flowing through the first and second MOSFETs. A current circuit outputs reference current whose value lies between current flowing through the first MR element of the low and high resistance states. A third MOSFET has one end that receives the reference current and is connected to its own gate terminal. The gate terminal of the second MOSFET receives the same potential as the gate terminal of the third MOSFET. A first resistance element is connected to the others end of the third MOSFET and has the same resistance as the second magnetoresistive effect element.

20 Claims, 6 Drawing Sheets

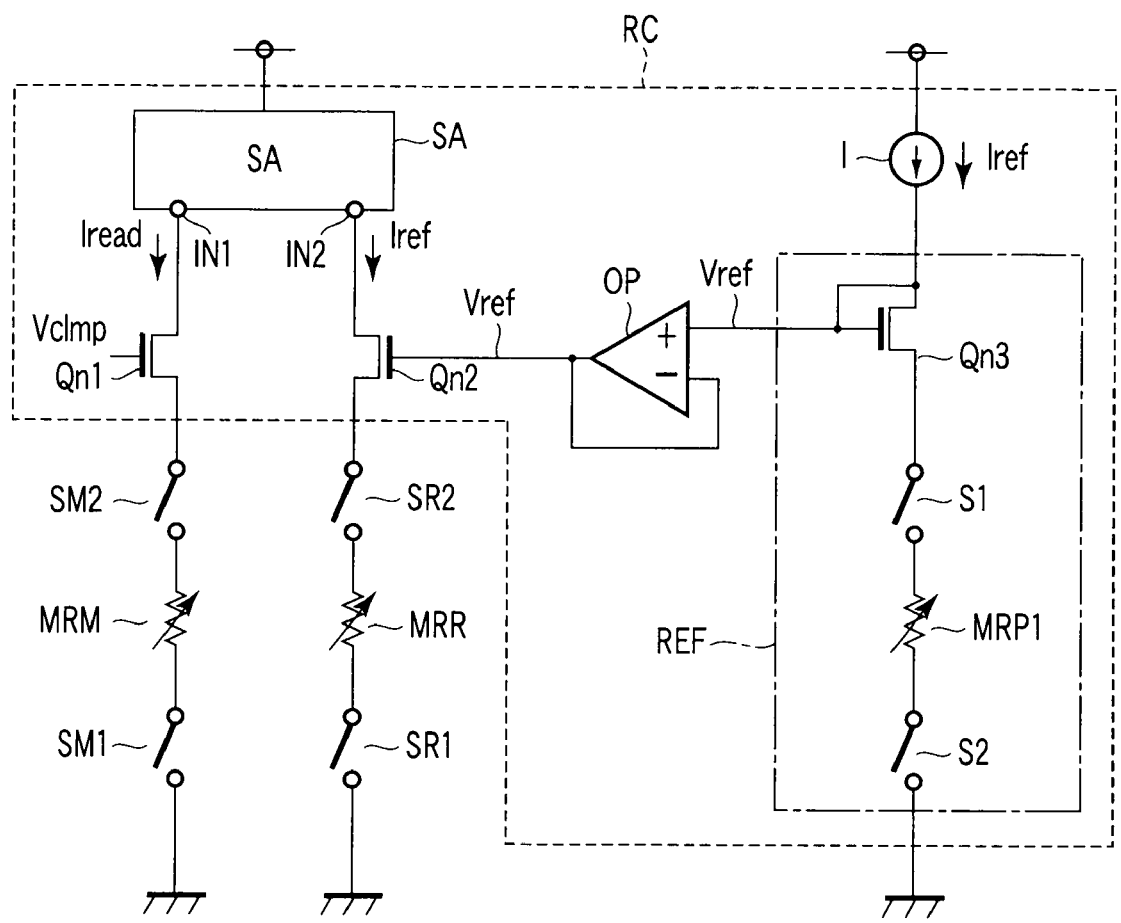
F I G. 4

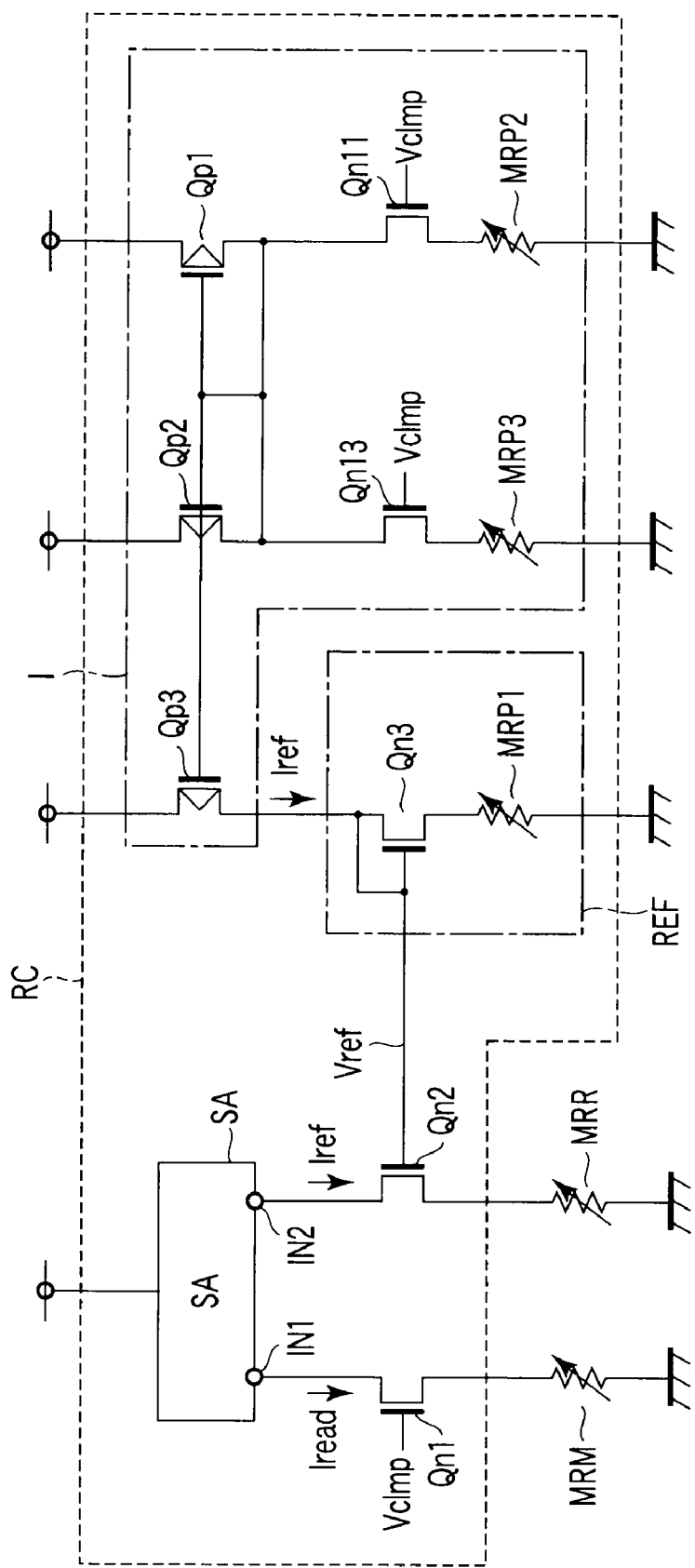
F I G. 5

MAGNETORESISTIVE RANDOM ACCESS MEMORY

CROSS-REFERENCE TO RELATED APPLICATIONS

This application is based upon and claims the benefit of priority from prior Japanese Patent Application No. 2007-175564, filed Jul. 3, 2007, the entire contents of which are incorporated herein by reference.

BACKGROUND OF THE INVENTION

1. Field of the Invention

The present invention relates to a magnetoresistive random access memory, in particular, for example, the read circuit configuration of the magnetoresistive random access memory.

2. Description of the Related Art

Magnetoresistive random access memory (MRAM) is the nonvolatile memory that can be accessed high-speed. MRAM uses magnetoresistive effect (MR) elements to store information. A MR element takes two different resistance, corresponding to the state of magnetization. Reading is performed by distinguishing the resistance of MR elements. Therefore, the reading method of detecting the resistance of the MR element with sufficient accuracy is needed.

One of the reading methods is the differential amplification system. In the differential amplification system, the read signal current value according to the resistance state of the MR element in the memory cell for storing information is compared with reference current, and the difference of two current values is amplified. It is known that the reference signal is obtained by combing MR elements for reference cells that have different resistances to generate the mean resistance of the two resistances of MR elements for memory cells. However, this method requires more than one reference cells to generate one reference signal. For this reason, the number of the reference cells arranged in a memory cell array increases, and the share in the memory cell array of a memory cell falls.

As technology of avoiding this problem, the method of generating a reference signal by one reference cell is disclosed in the U.S. Pat. No. 6,496,436. In this method, the read bias voltage applied to a memory cell and the read bias voltage applied to a reference cell are different. And the value of the reference current that flows through a reference cell is set to the middle of the two read signal current values obtained with the two resistance values of the magnetic resistance elements for cells. Specifically, assume that the bias voltage applied to the reference cell is (Vbias1/2)+(1+Rmin/Rmax), where a bias voltage applied to the memory cell is Vbias1, the lower resistance of the memory cell is Rmin, and the higher resistance of the memory cell is Rmax. And the resistance of the reference cell is fixed to Rmax, which allows current flowing through the reference cell to be a middle of the value of current that flows through the memory cell at the low resistance state and that at high resistance state.

U.S. Pat. No. 6,496,436 discloses the circuit that generates a reference bias voltage in FIG. 3. This circuit combines an operational amplifier and dummy cells to generate the reference bias voltage. Since the reference voltage is directly applied to the reference cell, the clamp circuit that uses the negative feedback by operational amplifiers 35 and 45 as shown in FIG. 1 is needed.

This clamp circuit is required for every read circuit. And a read circuit is prepared for every memory cell block, which is an access unit of data. For this reason, it is necessary to prepare such more than one clamp circuits for a memory chip. Therefore, the cramp circuits, which are big due to operational amplifiers, occupy a large area of MRAM, resulting in smaller area available for providing memory cells.

Moreover, more than one read circuits are activated, namely, more than one clamp circuits are activated at the time of reading. For this reason, the operational amplifiers that need current flowing through them at the time of operation increase the power consumption of MRAM.

BRIEF SUMMARY OF THE INVENTION

According to an aspect of the present invention, there is provided a magnetoresistive random access memory comprising: a first magnetoresistive effect element that takes a low resistance state and a high resistance state; a second magnetoresistive effect element fixed to a low resistance state or a high resistance state; a first MOSFET having a first end connected to the first magnetoresistive effect element and having a gate terminal that receives first potential; a second MOSFET having a first end connected to the second magnetoresistive effect element; a sense amplifier amplifying a difference between a value of current that flows through a second end of the first MOSFET and a value of current that flows through a second end of the second MOSFET; a current circuit outputting reference current whose value lies between current that flows through the first magnetoresistive effect element of the low resistance state and current that flows through the first magnetoresistive effect element of the high resistance state; a third MOSFET having a first end that receives the reference current and is connected to its own gate terminal, a gate terminal of the second MOSFET receiving substantially the same potential as the gate terminal of the third MOSFET; and a first resistance element connected to a second end of the third MOSFET and having substantially the same resistance as the second magnetoresistive effect element.

BRIEF DESCRIPTION OF THE SEVERAL VIEWS OF THE DRAWING

FIG. 4 is a circuit diagram schematically showing main parts of a MRAM according to a second embodiment.

FIG. 5 is a circuit diagram schematically showing main parts of the read circuit of a MRAM according to a third embodiment.

DETAILED DESCRIPTION OF THE INVENTION

Embodiments of the present invention are explained with reference to drawings below. Note that components having substantially the same function and structure are denoted by the same reference symbols and a duplicated description will be given only when necessary in the following description. It should be noted that drawings are schematic and the relation between thickness and a plane dimension and the ratio of among each layer thickness etc. differ from actual ones. Therefore, specific thickness or dimension should be determined in consideration of the following explanation. Moreover, drawings should include portions where the relation and/or ratio between dimensions differ among drawings.

Moreover, each embodiment shown below illustrates apparatus and the method for materializing the technical idea of the present invention, and the technical idea of the present invention does not specify the material, form, configuration, or arrangement of components to the following description. The technical idea of the present invention can be modified within the scope of claims.

First Embodiment

Figure 1:
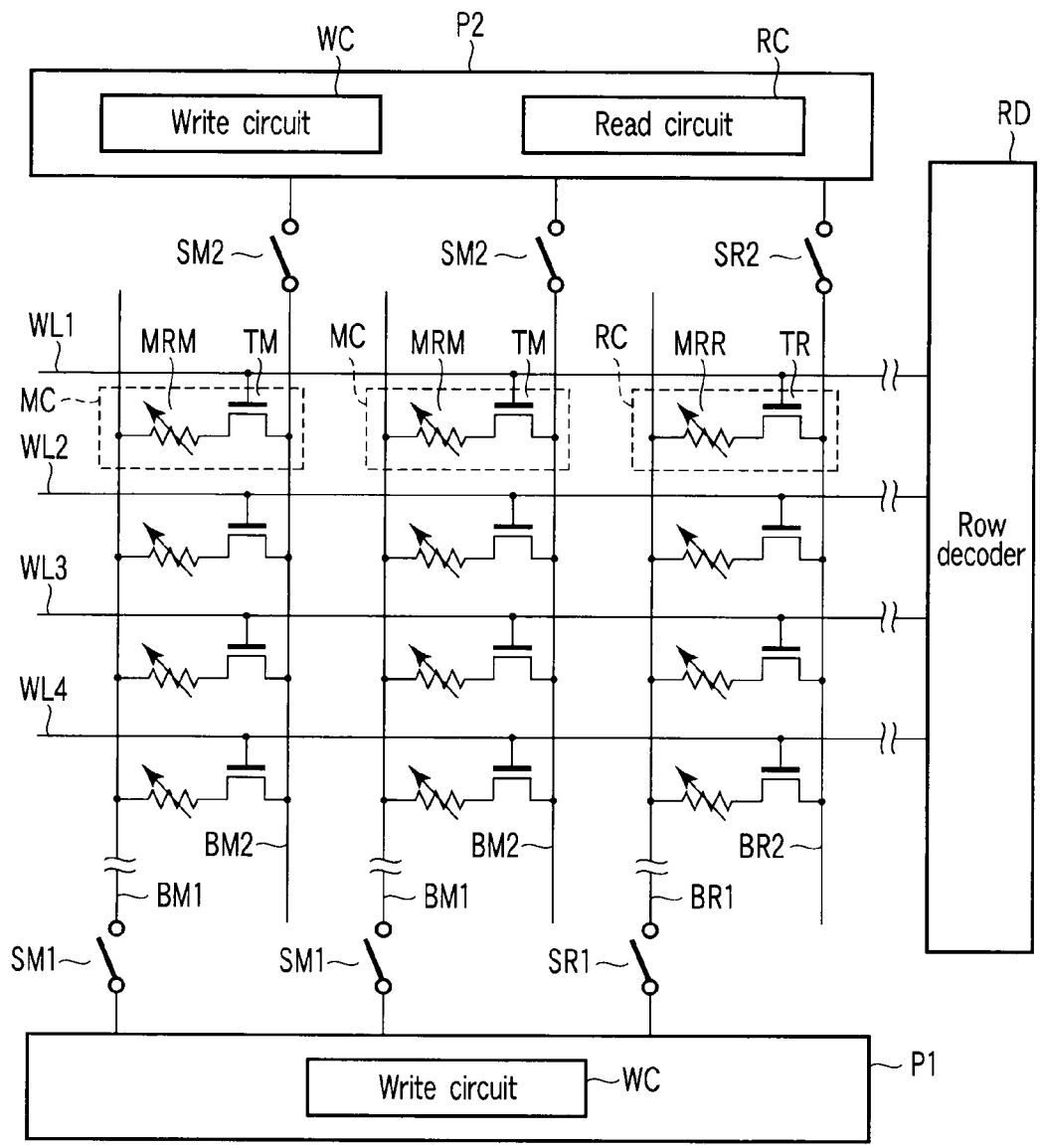
FIG. 1 is a circuit diagram schematically showing main parts of a MRAM according to a first embodiment.
Figure 2:
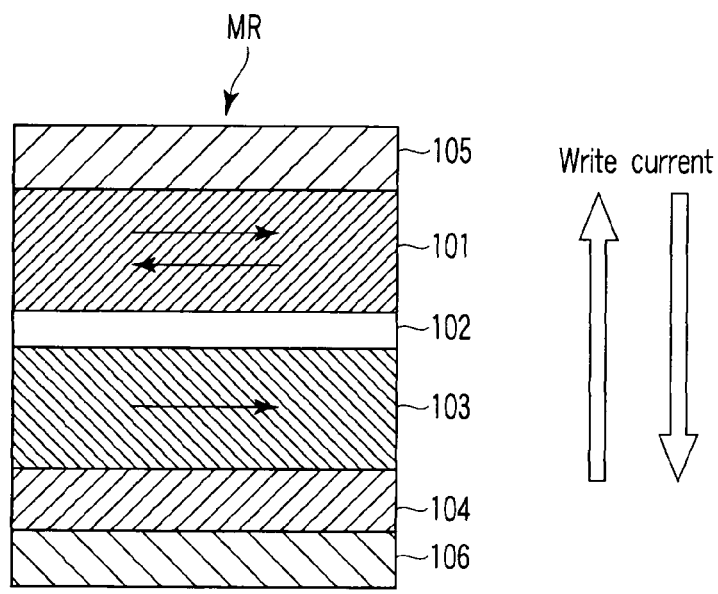
FIG. 2 is a sectional view of an MR element applicable to the first embodiment.
Figure 3:
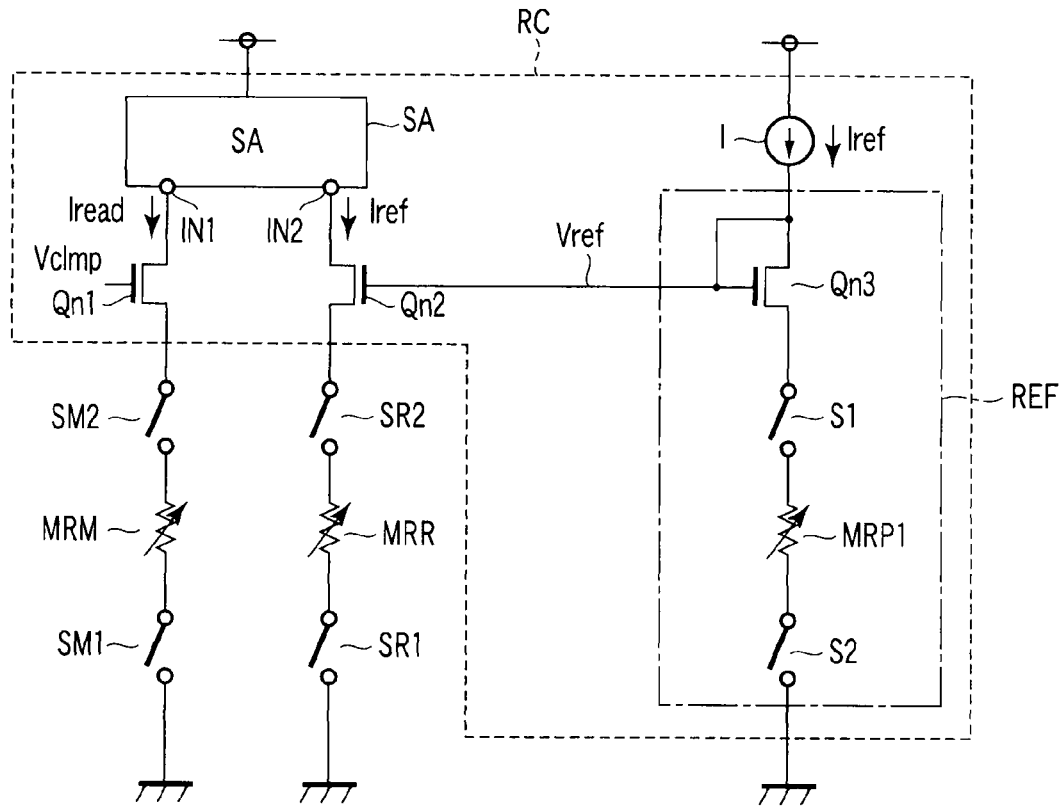
FIG. 3 is a figure showing the configuration of the circuit concerning to reading of the first embodiment.

With reference to FIGS. 1 to 3, the magnetoresistive random access memory according to the first embodiment of the present invention is explained. FIG. 1 is a circuit diagram schematically showing main parts of the magnetoresistive random access memory according to the first embodiment. As shown in FIG. 1, memory cells MC and reference cells RC are arranged in a matrix. The memory cell MC consists of a magnetoresistive effect (MR) element MRM and a select transistor TM that are connected in series. The reference cell RC consists of a MR element MRR and a select transistor TR that are connected in series. Select transistors TM and TR consist of, for example, n-type metal oxide semiconductor field effect transistor (MOSFET).

MR elements MRM and MRR can take at least two stationary states in accordance with its internal magnetization state. More specifically, MR elements MRM and MRR are designed to take a low resistance state or a high resistance state when flow of spin-polarized electrons (spin-polarized current) is supplied from one end to the other end. MR elements MRM and MRR can store data of two values by making one of the two resistance states correspond to "0" data and the other to "1" data. The MR element MRR of the reference cell RC is formed by the same process as the MR element MRM of a memory cell MC, and, therefore, film thickness, materials, etc. are the same. However, the MR element MRR is designed to keep its internal magnetization state from changing substantially.

Here, MR elements MRM and MRR are explained with reference to FIG. 2. FIG. 2 is a sectional view of an MR element which can be used as MR elements MRM and MRR. As most typical example, MR element MR includes, for example, a fixed layer 103 formed of a ferromagnetic material, the intermediate layer 102 formed of a nonmagnetic material, and the free layer (record layer) 101 formed of a ferromagnetic material that are stacked in the mentioned order, as shown in FIG. 2.

Free layer 101 and/or fixed layer 103 can also be lamination structure that consists of more than one sublayers. The magnetization direction of fixed layer 103 is fixed. The fixation can be achieved by, for example, forming an antiferromagnetic layer 104 on the surface of fixed layer 103 opposite to the nonmagnetic layer.

On the other hand, such a fixation mechanism is not provided for the magnetization direction of free layer 101. Therefore, the magnetization direction of free layer 101 can change. The magnetization easy axis of free layer 101 and the magnetization direction of fixed layer 103 are directed along surfaces with which free layer 101, intermediate layer 102, and fixed layer 103 face each other. That is, MR element MR has so-called in-plane magnetization.

Nonmagnetic metal, nonmagnetic semiconductor, insulator, etc. can be used as intermediate layer 102.

Furthermore, electrodes 105 and 106 may be formed on the surface of free layer 101 opposite to the nonmagnetic layer 102 and on the surface of the antiferromagnetic layer 104 opposite to fixed layer 103, respectively.

Electron flow is conducted towards free layer 101 from fixed layer 103 in order to change the magnetization of free layer 101 that has a direction antiparallel with that of fixed layer 103 to have a direction parallel with that of fixed layer 103. On the contrary, electron flow is conducted towards fixed layer 103 from free layer 101 in order to change the magnetization of free layer 101 that has a direction parallel with that of fixed layer 103 to have a direction antiparallel with that of fixed layer 103.

For example, Co, Fe, Ni, or the alloy containing these can be used as a ferromagnetic material used for free layer 101 and fixed layer 103. As a material of antiferromagnetic layer 104, Fe—Mn, Pt—Mn, Pt—Cr—Mn, Ni—Mn, Pd—Mn, NiO, $Fe_2O_3$, a magnetic semiconductor, etc. can be used.

When using nonmagnetic metal as intermediate layer 102, Au, Cu, Cr, Zn, Ga, Nb, Mo, Ru, Pd, Ag, Hf, Ta, W, Pt or the Bi, or the alloy containing one of them or more can be used. Moreover, when intermediate layer 102 is used to operate as a tunnel barrier layer, $Al_2O_3$, $SiO_2$, MgO, AlN, etc. can be used.

Note that MR element MR may have the upside-down form of configuration shown in FIG. 2. Moreover, magnetization of free layer 101 and fixed layer 103 may have the direction that penetrates each layer of MR element MR. That is, MR element MR may have so-called perpendicular magnetization.

MRAM is configured to have capability to supply current to MR element MRM for any selected one of memory cells MC in both directions to set it to the low or high resistance state. Conducting such current can be achieved by various configurations, and the present invention is not limited by the specific application. An example is explained below.

For example, as shown in FIG. 1, any selected one of columns (the third column in FIG. 1, as an example) is assigned to the reference cells RC. Free layers 101 of the MR elements MRR of the reference cell RC are configured to keep its magnetization from reversing, or they are fixed, for example.

One end of each of memory cell MC and reference cell RC (for example, the MR element side) is connected to bit lines BM1 and BR1, respectively. Bit lines BM1 and BR1 are connected to peripheral circuit P1 through switch circuits SM1 and SR1, respectively. Peripheral circuit P1 includes a write circuit WC.

The other end of each of memory cell MC and reference cell RC (for example, the select transistor side) is connected to bit lines BM2 and BR2, respectively. Bit lines BM2 and BR2 are connected to peripheral circuit P2 through switch circuits SM2 and SR2, respectively. Peripheral circuit P2 includes a write circuit WC and a read circuit RC.

Switch circuits SM1 and SM2 are turned on and off in accordance with signals according to the address signal that specifies an access-target memory cell MC. Switch circuits SR1 and SR2 are turned on upon reading. Switch circuits SM1, SM2, SR1, and SR2 are constituted by, for example, a MOSFET. And peripheral circuits P1 and P2 are electrically connected to the access-target memory cell MC by turning on switch circuits SM1 and SM2 that are connected to bit lines BM1 and BM2 that are connected to the access-target memory cell MC.

The write circuit WC includes current source/sink circuit(s). Current source/sink circuit supplies current to bit lines BM1 and BM2 connected thereto, and draws current from bit lines BM1 and BM2 connected thereto.

Gate terminal (electrode) of select transistors TM and TR of the n-th (n being a natural number) row are connected to a word line WLn. The word line WLn is connected to row decoder RD. Row decoder RD activates word line WLn specified by the address signal supplied from the outside of the MRAM.

Read circuit RC contains circuit(s) for supplying read current, the sense amplifier, etc. as is explained in more detail later. The circuit for supplying of read current supplies the current of magnitude large enough to detect data that is stored in MR element for cells MRM in accordance with its magnetization state upon reading. A sense amplifier supplies current to MR element for cells MRM, and judges the resistance state. Specific configuration and operation of read circuit RC are explained in more detail later.

In the example of FIG. 1, write circuits WC are arranged to the both ends of a memory cell array. However, it is not restricted to this example, but write circuit WC may be realized in any form as long as it has a configuration that can conduct bidirectional current through any selected one of memory cells MC as mentioned above. For example, a pair of write circuits WC may both be arranged at the top or bottom ends of the memory cell array.

Similarly, although read circuit RC is connected to upper ends of bit lines BM2 and BR2 in the example of FIG. 1, the connection is not limited to this. Any arrangement is possible as long as it can conduct current through MR element for cells MRM and can determine the resistance state. For example, the read circuit may be connected to bottom ends of bit lines BM2 and BR2, or connected to bit lines BM1 and BR1.

When writing data in a memory cell MC, the select transistor TM in the write-target memory cell MC is turned on, and switch circuits SM1 and SM2 that are connected to bit lines BM1 and BM2 in the memory cell column containing the target memory cell MC are turned on. One of two write circuits WC, then, functions as a current sourcing circuit and the other functions as a current sink circuit. As a result, write current flows between write circuits WC through switch circuit SM1, bit line BM1, write-target memory cell MC, bit line BM2, and switch circuit SM2.

Next, with reference to FIG. 3, the read circuit and its operation are explained. FIG. 3 shows the configuration of the circuit concerning reading of the first embodiment. More specifically, FIG. 3 extracts and shows components concerning reading of one memory cell MC, and it also shows one reference cell RC used for reading of the memory cell MC. Note that select transistor TM and TR are omitted in FIG. 3 since they are turned on upon reading.

As shown in FIG. 3, read circuit RC includes a sense amplifier SA, n-type MOSFETs Qn1 and Qn2 for clamp, and a Vref generation circuit REF. Vref generation circuit REF contains a constant current circuit I, an n-type MOSFET Qn3 for clamp, switch circuits S1 and S2, and a replica resistance MRP1. Vref generation circuit REF controls the value of the reference current supplied to MR element for reference MRR.

One end of MR element MRM of the read-target memory cell is connected to a common potential (earth potential) end through switch circuit SM1. The other end of MR element for cells MRM is connected to one end of transistor Qn1 through switch circuit SM2. The other end of transistor Qn1 is connected to first input end IN1 of sense amplifier SA. The fixed potential Vclmp is applied to the gate terminal of transistor Qn1. Transistor Qn1 uses its gate terminal voltage to adjust its sauce terminal voltage to approximately (gate voltage—threshold value voltage). The bias voltage applied to MR element for cells MRM is determined by the value of potential Vclmp.

One end of MR element for reference MRR is connected to the common potential end through switch circuit SR1. The other end of MR element for reference MRR is connected to one end of transistor Qn2 through switch circuit SR2. The other end of transistor Qn2 is connected to second input end IN2 of sense amplifier SA. Transistor Qn2 uses its gate terminal voltage to adjust its sauce terminal voltage to approximately (gate voltage—threshold value voltage). Sense amplifier SA compares a read current Iread that flows through first input terminal IN1 and reference current Iref that flows through second input terminal IN2 to obtain their difference and amplifies the difference.

The resistance state of MR element for reference MRR (relation between the magnetization direction of its free layer and that of its fixed layer) is fixed to either the low or high resistance state. For example, when read current Iread is set to flow through MR element MRM in the direction that sets the MR element for reference MRR to the low resistance state, MR element for reference MRR can be fixed to the low resistance state. This can prevent reference current Iref from accidentally switching MR element for reference MRR to the high resistance state. It is because reference current Iref that flows through MR element for reference MRR always flows in the same direction as read current Iread, and MR element for reference MRR is fixed to the same resistance state as that brought by the reference current Iref of this direction.

Reference current Iref, which is input to sense amplifier SA, is generated using MR element for reference MRR. And MR element for reference MRR has the same characteristic as MR element for cells MRM. For this reason, first and second input terminals IN1 and IN2 of sense amplifier SA have the same charge characteristic (same RC characteristic). On the contrary, if MR element is not used for generation of reference current Iref, the charge time of first and second input terminals IN1 and IN2 would be different. This prevents high-speed operation of sense amplifier SA. The large difference in the charge characteristic between input terminals of a sense amplifier is not a problem in, for example, a NOR type flash memory etc., which does not require high-speed operation so much from its application. However, only a slight difference in charge time is problematic in a MRAM, which is required to operate at a very high speed. Then, high-speed operation of sense amplifier SA is attained as mentioned above by setting the charge characteristic of first and second input terminals IN1 and IN2 close to each other.

Constant current circuit I outputs reference current Iref of a predetermined value. Reference current Iref has the mean value of current that flows through MR element for cells MRM of the low resistance state, and current that flows through MR element for cells MRM of the high resistance state. Constant current circuit I is connected to one end of transistor Qn3. The said one end of transistor Qn3 is also connected to gate terminal thereof.

Transistor Qn3 has the same size (as a result, the same current drive capability) as transistor Qn2. The other end of transistor Qn3 is connected to one end of the switch circuit S1. The switch circuit S1 may consist of, for example, a MOSFET.

The other end of the switch circuit S1 is connected to one end of replica resist element MRP1. The other end of replica resist element MRP1 is connected to the common potential end through switch circuit S2. Switch circuit S2 may consist of, for example, a MOSFET.

Replica resist element MRP1 has the same resistance as MR element for reference MRR. For this purpose, for example, replica resist element MRP1 may consist of MR element, and has its resistance state fixed. In this example, desirably, replica MR element MRP1 is fixed to the same resistance state as that of the MR element for reference MRR brought by reference current Iref that flows through replica MR element MRP1. This can prevent the output current from constant current circuit I from accidentally performing writing on replica MR element MRP1. For example, replica resist element MRR is fixed to the low resistance state.

More specifically, replica MR element MRP1 has the same characteristic as MR element for cells MRM and MR element for reference MRR, and can be fixed to the same resistance state as MR element for reference MRR. Replica MR element MRP1 is formed by the same material and the same process as, for example, MR element for cells MRM and MR element for reference MRR, and it is created to have the same form and film thickness, and has the configuration of, for example, FIG. 2. Therefore, MR element for cells MRM and MR element for reference MRR, and replica MR element MRP have the same characteristic theoretically. That is, if the difference of the characteristic resulting from the variation on a manufacturing process etc. is ignored, three MR elements have the same resistance in the low and high resistance states. The three MR elements exhibit vertically the same resistance even if the variation in the characteristic is considered.

The gate terminal of transistor Qn2 is connected directly or indirectly through a circuit to the gate terminal of transistor Qn3, so that the two terminals have the same potential. In FIG. 3, the gate terminals of transistor Qn2 and Qn3 are connected directly.

As described above, transistors Qn2 and Qn3 have the same size, are applied the same potential Vref at their respective gate terminal, and are respectively connected to element MRR and MRP1 of the same resistance at their respective source terminal. Therefore, Vref generation circuit REF functions as a current transmission circuit, and the current of the same value as reference current Iref that constant current circuit I outputs flows through second input terminal IN2 of sense amplifier SA.

Note that one MRAM chip has one Vref generation circuit REF. And one MRAM chip has more than one read circuits RC, and these read circuits RC share one Vref generation circuit REF. Therefore, one gate terminal of transistor Qn3 is connected to each gate terminal of more than one transistors Qn2. And gate terminals of transistors Qn2 and Qn3 are connected directly. Since it is connected directly, unlike a connection through a circuit, a difference does not arise in the potential of the gate terminal of transistor Qn2 and that of the gate terminal of transistor Qn3. For this reason, the variation in the potential among gate terminals of transistors Qn2 is also small, and advantage of uniform operating characteristic is obtained.

On the other hand, since the gate terminal of transistor Qn3 is connected to gate terminals of more than one transistors Qn2, charge of the potential of the gate terminal of transistor Qn2 takes time. However, this charge occurs when power supply to MRAM starts, and is not necessarily carried out for every subsequent read operation. For this reason, a significant problem is not produced though charge takes time.

As described above, according to the magnetoresistive random access memory of the first embodiment, the gate terminal of transistor Qn2 that is connected to MR element for reference MRR receives potential of gate and source terminals of transistor Qn3 that has the same size as transistor Qn2 and is connected to replica MR element MRP1 of the same size as transistor Qn2. For this reason, the current of the same value as reference current Iref, which flows through transistor Qn3, can be supplied to the input terminal of sense amplifier SA connected to transistor Qn2. And since such operation can be realized in a simple circuit that does not include an operational amplifier, the area of read circuit RC and the power consumed by read operation can be reduced.

Second Embodiment

The second embodiment concerns the connection between transistors Qn2 and Qn3. FIG. 4 is a circuit diagram schematically showing main parts of the magnetoresistive random access memory according to the second embodiment of the present invention. As shown in FIG. 4, in read circuit RC, the potential of the gate terminal of transistor Qn3 is transmitted to the gate terminal of transistor Qn2 through a unity gain buffer.

Specifically, the gate terminal of transistor Qn3 is connected to the non-reversed input terminal of an operational amplifier OP. The output terminal of operational amplifier OP is connected to the gate terminal of transistor Qn2 and its own reversed input terminal. Even if transistors Qn2 and QN3 are connected in this way, gate terminals of transistor Qn2 and Qn3 can have the same potential. The remaining parts are the same as the first embodiment.

Connecting gate terminals of transistor Qn2 and QN3 through operational amplifier OP can charge the gate terminal of transistor Qn2 more quickly than the first embodiment. Therefore, the second embodiment is effective when there are many read circuits RC, therefore when there are many transistors Qn2.

According to the magnetoresistive random access memory of the second embodiment of the present invention, Vref generation circuit REF is used to apply reference current Iref from constant current circuit I to second input terminal IN2 of sense amplifier SA, as in the first embodiment. Therefore, the same effect as the first embodiment can be acquired.

Moreover, according to the second embodiment, operational amplifier OP is used to transmit the potential of the gate terminal of transistor Qn3 to the gate terminal of transistor Qn2. This can shorten charge time of the gate terminal of transistor Qn2.

Third Embodiment

The third embodiment concerns the example of constant current circuit I of first and second embodiments.

FIG. 5 is a circuit diagram schematically showing main parts of read circuit RC of the magnetoresistive random access memory according to the third embodiment of the present invention. Constant current circuit I has the configuration shown in FIG. 5.

As shown in FIG. 5, in constant current circuit I, p-type MOSFET Qp1, an n-type MOSFET Qn11, and a replica MR element MRP2 are serially connected. The serially-connected structure is connected between the power supply potential end and the common potential end. The gate terminal of transistor Qp1 is connected to the drain terminal thereof. Clamp potential Vclmp is supplied to the gate terminal of transistor Qn11.

In constant current circuit I, a p-type MOSFET Qp2, an n-type MOSFET Qn13, and a replica MR element MRP3 are serially connected. The serially-connected structure is connected between the power supply potential end and the common potential end (the earth). The gate terminal of transistor Qp2 is connected to the gate terminal of transistor Qp1 and the drain terminal thereof. Clamp potential Vclmp is supplied to the gate terminal of transistor Qn13.

Gate terminals of transistors Qp1 and Qp2 are connected to the gate terminal of p-type MOSFET Qp3. One end of transistor Qp3 is connected to the power supply potential end, and the other end functions as an output end of constant current circuit I and is connected to one end of transistor Qn3.

Replica MR elements MRP2 and MRP3 theoretically have the same characteristic as MR element for cells MRM. That is, if the difference of the characteristic resulting from the variation on a manufacturing process etc. is ignored, replica MR elements MRP2 and MRP3 have the same resistance in both the low and high resistance states as MR element for cells MRM. They exhibit vertically the same resistance even if the variation in the characteristic is considered. And one of replica MR elements MRP2 and MRP3 is fixed to the high resistance state, and the other one is fixed to the low resistance state.

Vref generation circuit REF is the same as the first embodiment (FIG. 3). The remaining parts are the same as the first embodiment. Note that, in FIG. 5, switch circuit SM1, SM2, SR1, SR2, S1, and S2 are omitted as they show that they are on.

Note that it is also possible to supply the output Vref of the Vref generation circuit REF to the gate terminal of transistor Qn2 through a unity gain buffer as in the second embodiment. According to this configuration, the advantage described with the second embodiment can be acquired.

Constant current circuit I has the configuration described above, and one of replica MR elements MRP2 and MRP3 is fixed to the low resistance state and the other one is fixed to the high resistance state. For this reason, reference current Iref, which is the output of constant current circuit I, is equal to the average of the current that flows through MR element for replica cells MRR of the low resistance state, and the current that flows through MR element for replica cells MRR of the high resistance state. The average value is substantially equal to the average of the current that flows through MR element MRM for memory cells of a low resistance state, and the current that flows through MR element MRM for memory cells of a high resistance. This is because replica MR elements MRP2, MRP3, and MR element MRM for memory cells substantially have the same the characteristic as described above.

According to the magnetoresistive random access memory of the third embodiment, reference current Iref that is generated using replica MR elements MRP2 and MRP3 of the high resistance state and the low resistance state, respectively, is transmitted to second input terminal IN2 of sense amplifier SA using Vref generation circuit REF as in the first embodiment. For this reason, it is possible to supply reference current Iref that has the mean value between the current that flows through MR element for cells MRM of the low resistance state and the current that flows through MR element for cells MRM of the high resistance state to sense amplifier SA using a simple circuit. This can achieve reduction of the area of a read circuit and power consumed by read operation.

Fourth Embodiment

The fourth embodiment concerns the example of constant current circuit I of first and second embodiment.

Figure 6:
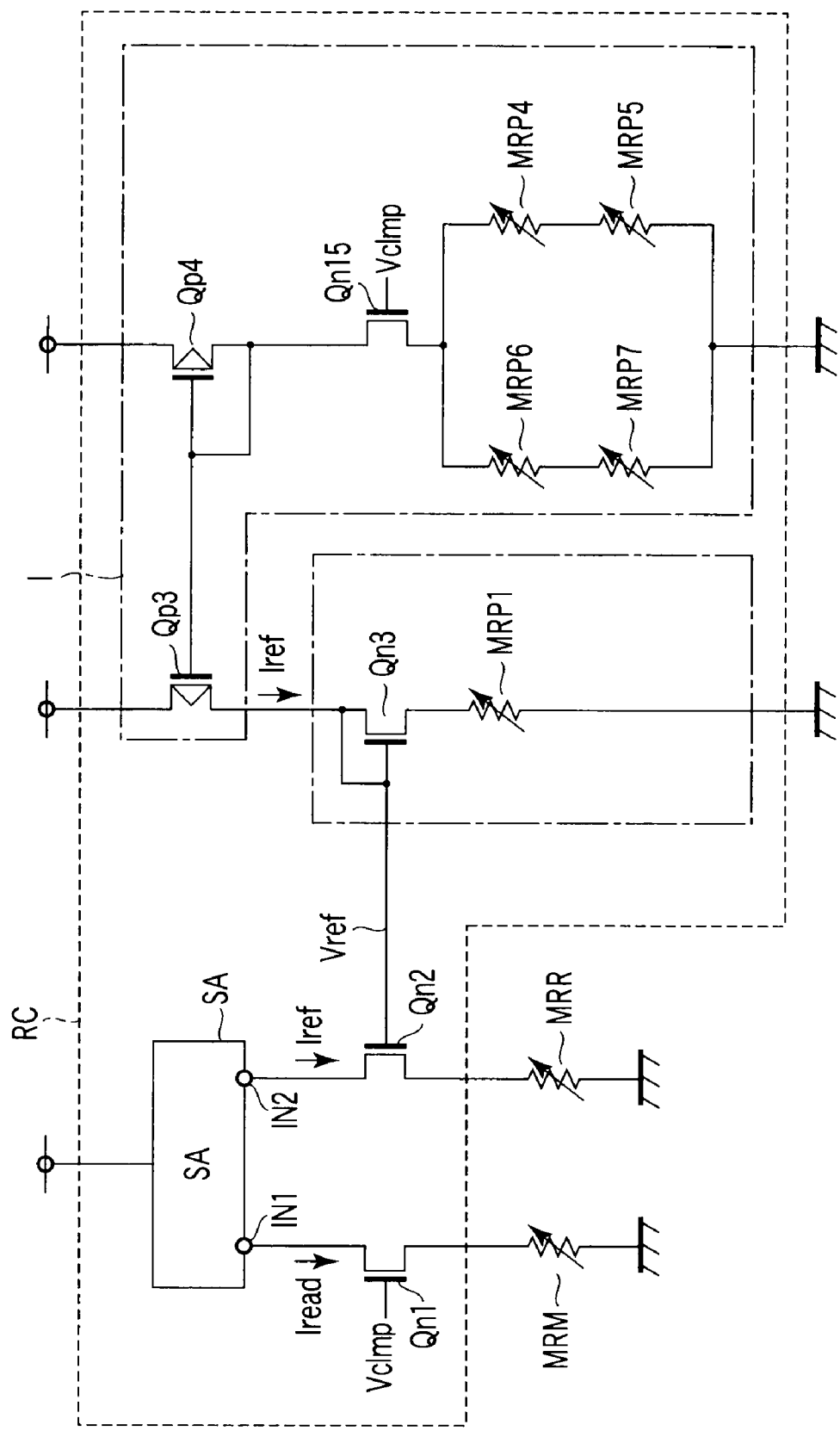
FIG. 6 is a circuit diagram schematically showing main parts of the read circuit of a MRAM according to the fourth embodiment.

FIG. 6 is a circuit diagram schematically showing main parts of read circuit RC of the magnetoresistive random access memory according to the fourth embodiment of the present invention. Constant current circuit I has the configuration shown in FIG. 6.

As shown in FIG. 6, in constant current circuit I, a p-type MOSFET Qp4, an n-type MOSFET Qn15, and two replica MR elements MRP4 and MRP5 are serially connected. The serially-connected structure is connected between the power supply potential end and the common potential end. Moreover, serially-connected two replica MR elements MRP6 and MRP7 are connected in parallel with replica MR elements MRP4 and MRP5.

The gate terminal of transistor Qp4 is connected to the drain terminal thereof, and the gate terminal of transistor Qp3. The clamp potential Vclmp is supplied to the gate terminal of transistor Qn15.

Replica MR elements MRP4, MRP5, MRP6, and MRP7 theoretically have the same characteristic as MR element MRM for memory cells. That is, if the difference of the characteristic resulting from the variation on a manufacturing process etc. is ignored, replica MR elements MRP4 to MRP7 have the same resistance in both the low and high resistance states as MR element for cells MRM. They exhibit the vertically same resistance even if the variation in the characteristic is considered. Replica MR elements MRP4 and MRP5 are fixed to the high resistance state, and replica MR elements MRP6 and MRP7 are fixed to the low resistance state.

Vref generation circuit REF has the same configuration as the third embodiment. The remaining parts are the same as the first embodiment. Note that, in FIG. 6, switch circuits SM1, SM2, SR1, SR2, S1, and S2 are omitted as they show that they are on.

Note that it is also possible to supply the output Vref of the Vref generation circuit REF to the gate terminal of transistor Qn2 through a unity gain buffer as in the second embodiment. According to this configuration, the advantage described with the second embodiment can be acquired.

Constant current circuit I has the configuration described above, and replica MR elements MRP4 and MRP5 are fixed to the high resistance state, and replica MR elements MRP6 and MRP7 are fixed to the low resistance state. For this reason, reference current Iref, which is the output of constant current circuit I, is equal to the average of the current that flows through MR element for replica cells MRR of the low resistance state, and the current that flows through MR element for replica cells MRR of the high resistance state. The average value is substantially equal to the average of the current that flows through MR element for cells MRM of the low resistance state, and the current that flows through MR element for cells MRM of the high resistance. This is because replica MR elements MRP4 to MRP7, and MR element for cells MRM have substantially the same characteristic as described above.

According to the magnetoresistive random access memory of the fourth embodiment, reference current Iref that is generated using replica MR elements MRP4 and MRP5 of the high resistance state and replica MR elements MRP6 and MRP7 of the low resistance state is transmitted to second input terminal IN2 of sense amplifier SA using Vref generation circuit REF as in the first embodiment. For this reason, it is possible to supply reference current Iref that has the mean value between the current that flows through MR element of the low resistance state and the current that flows through MR element for cells MRM of the high resistance state to sense amplifier SA using a simple circuit. This can achieve reduction of the area of a read circuit and power consumed by read operation.

Moreover, according to the fourth embodiment, reference current Iref is generated using the parallel structure of serially-connected replica MR elements MRP4 and MRP5 of the high resistance state and serially-connected replica MR elements MRP6 and MRP7 of the low resistance state. This can suppress the current during the standby time.

Fifth Embodiment

The fifth embodiment concerns the example of sense amplifier SA of the first to fourth embodiments.

Figure 7:
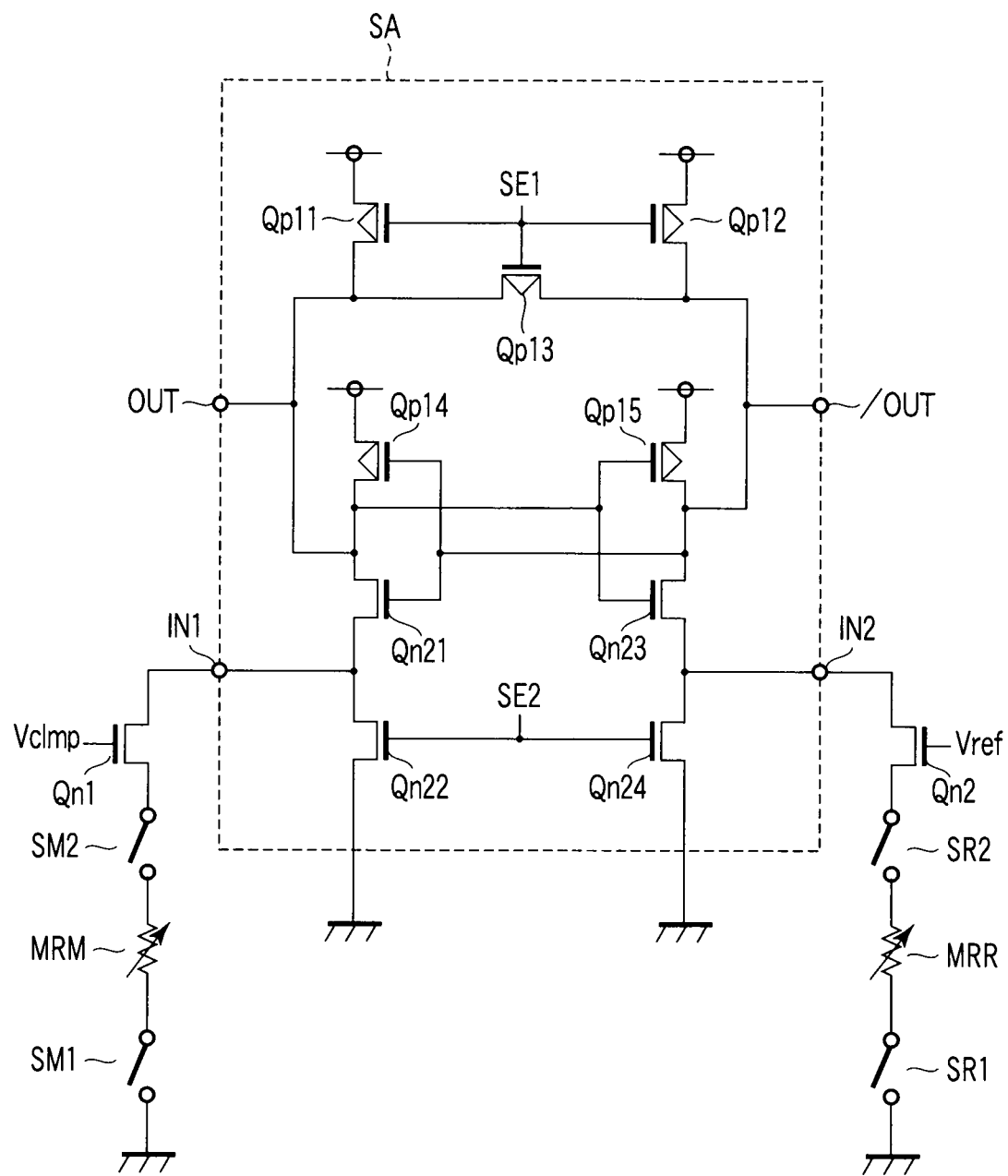
FIG. 7 is a circuit diagram schematically showing main parts of a sense amplifier SA for MRAMs according to a fifth embodiment.

FIG. 7 is a circuit diagram schematically showing main parts of sense amplifier SA of the magnetoresistive random access memory according to the fifth embodiment of the present invention. As shown in FIG. 7, one end of each of p-type MOSFETs Qp11 and Qp12 is connected to the power supply potential end. Gate terminals of transistors Qp11 and Qp12 are connected to each other and connected to the gate terminal of a p-type MOSFET Qp13. Control signal SE1 is supplied to the gate terminal of transistor Qp13. One end of transistor Qp13 is connected to the other end of transistor Qp11 and functions as a first output end OUT of sense amplifier SA. The other end of transistor Qp13 is connected to the other end of transistor Qp12 and functions as a second output end /OUT of sense amplifier SA. The potential of the first output end OUT and that of the second output end /OUT are complementary to each other.

A p-type MOSFET Qp14 and two n-type MOSFETs Qn21 and Qn22 that are serially connected are connected between the power supply potential end and the common potential end. Gate terminals of transistors Qp14 and Qn21 are connected to each other and connected to second output end /OUT. The connection node of transistors Qp14 and Qn21 is connected to first output end OUT.

A p-type MOSFET Qp15 and two n-type MOSFETs Qn23 and Qn24 that are serially connected are connected between the power supply potential end and the common potential end. Gate terminals of transistors Qp15 and Qn23 are connected to each other and connected to first output end OUT. The connection node of transistors Qp15 and Qn23 is connected to second output end /OUT. The gate terminal of transistor Qn24 is connected to the gate terminal of transistor Qn22 and receives control signal SE2.

The connection node of transistors Qn21 and Qn22 functions as first input end IN1. First input end IN1 is connected to transistor Qn1. The connection node of transistors Qn23 and Qn24 functions as second input end IN2. Second input end IN2 is connected to transistor Qn2.

Sense amplifier SA according to the fifth embodiment is a current-difference amplification type, and it operates as follows. First, prior to operation, first and second output ends OUT and /OUT are precharged to the power supply potential Vdd. Switch circuit SM1, SM2, SR1, and SR2 are turned on to supply cell current and reference current to sense amplifier SA. Next, control signal SE1 is set to the low level to start the sense operation. As a result, the potentials according to data held by the memory cell appear at first and second output ends OUT and /OUT. Then, control signal SE2 is set to the high level after elapsing of suitable time to determine the potentials of first and second output ends OUT and /OUT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive random access memory comprising:
a first magnetoresistive effect element that takes a low resistance state and a high resistance state;
a second magnetoresistive effect element fixed to a low resistance state or a high resistance state;
a first MOSFET having a first end connected to the first magnetoresistive effect element and having a gate terminal that receives first potential;
a second MOSFET having a first end connected to the second magnetoresistive effect element;
a sense amplifier amplifying a difference between a value of current that flows through a second end of the first MOSFET and a value of current that flows through a second end of the second MOSFET;
a current circuit outputting reference current whose value lies between current that flows through the first magnetoresistive effect element of the low resistance state and current that flows through the first magnetoresistive effect element of the high resistance state;
a third MOSFET having a first end that receives the reference current and is connected to its own gate terminal, a gate terminal of the second MOSFET receiving substantially the same potential as the gate terminal of the third MOSFET; and
a first resistance element connected to a second end of the third MOSFET and having substantially the same resistance as the second magnetoresistive effect element.

2. The memory according to claim 1, wherein the first resistance element comprises a third magnetoresistive effect element that takes a low resistance state and a high resistance state.

3. The memory according to claim 2, wherein the first, second, and third magnetoresistive effect elements have substantially the same characteristic.

4. The memory according to claim 3, wherein the second and third magnetoresistive effect elements are fixed to the same resistance state.

5. The memory according to claim 4, wherein
the first magnetoresistive effect element takes one of the low and high resistance states when provided with current that flows in a first direction, the first direction corresponding to a direction of read current and
the second magnetoresistive effect element is fixed to the same resistance state of the first magnetoresistive effect element that is set by current flowing in the first direction.

6. The memory according to claim 1, wherein the reference current has a mean value between current that flows through the first magnetoresistive effect element of the low resistance state and current that flows through the first magnetoresistive effect element of the high resistance state.

7. The memory according to claim 1, wherein the current circuit comprises:
a fourth MOSFET having a first end connected to the first end of the third MOSFET;
a fifth MOSFET having a gate terminal connected to a gate terminal of the fourth MOSFET and to its own first end;
a sixth MOSFET having a first end connected to the first end of the fifth MOSFET and receiving the first potential at a gate terminal thereof;
a second resistance element connected to a second end of the sixth MOSFET and having substantially the same resistance as the first magnetoresistive effect element of the high resistance state;

a seventh MOSFET having a gate terminal connected to the gate terminal of the fourth MOSFET and to its own first end;

a eighth MOSFET having a first end connected to the first end of the seventh MOSFET and receiving the first potential at a gate terminal thereof; and a third resistance element connected to a second end of the eighth MOSFET and having substantially the same resistance as the first magnetoresistive effect element of the low resistance state.

8. The memory according to claim 7, wherein
the first, second, and third resistance elements comprise a third, fourth, and fifth magnetoresistive effect elements, respectively,
the first, second, third, fourth, and fifth magnetoresistive effect elements have substantially the same characteristic,
the second and third magnetoresistive effect elements are fixed to the same resistance state,
the fourth magnetoresistive effect element is fixed to a high resistance state, and
the fifth magnetoresistive effect element is fixed to a low resistance state.

9. The memory according to claim 1, wherein the current circuit comprises:
a fourth MOSFET having a first end connected to the first end of the third MOSFET;
a fifth MOSFET having a gate terminal connected to a gate terminal of the fourth MOSFET and to its own first end;
a sixth MOSFET having a first end connected to the first end of the fifth MOSFET and receiving the first potential at a gate terminal thereof;
a second resistance element and a third resistance element that are serially connected and have substantially the same resistance as the first magnetoresistive effect element of the high resistance state, a first end of the serially-connected structure of the second and third resistance elements being connected to a second end of the sixth MOSFET; and
a fourth resistance element and a fifth resistance element that are serially connected and have substantially the same resistance as the first magnetoresistive effect element of the low resistance state, the serially-connected structure of the fourth and fifth resistance elements being connected in parallel with the serially-connected structure of the second and third resistance elements.

10. The memory according to claim 9, wherein
the first, second, third, fourth, and fifth resistance elements comprise a third, fourth, fifth, sixth, and seventh magnetoresistive effect elements, respectively,
the first, second, third, fourth, fifth, sixth, and seventh magnetoresistive effect elements have substantially the same characteristic,
the second and third magnetoresistive effect elements are fixed to the same resistance state,
the fourth and fifth magnetoresistive effect elements are fixed to a high resistance state, and
the sixth and seventh magnetoresistive effect elements are fixed to a low resistance state.

11. The memory according to claim 1, further comprising an operational amplifier having a non-reversed end connected to the gate terminal of the third MOSFET and having an output end connected to a reversed end thereof and the gate terminal of the second MOSFET.

12. The memory according to claim 11, wherein the first resistance element comprises a third magnetoresistive effect element that takes a low resistance state and a high resistance state.

13. The memory according to claim 12, wherein the first, second, and third magnetoresistive effect elements have substantially the same characteristic.

14. The memory according to claim 3, wherein the second and third magnetoresistive effect elements are fixed to the same resistance state.

15. The memory according to claim 14, wherein
the first magnetoresistive effect element takes one of the low and high resistance states when provided with current that flows in a first direction, the first direction corresponding to a direction of read current and
the second magnetoresistive effect element is fixed to the same resistance state of the first magnetoresistive effect element that is set by current flowing in the first direction.

16. The memory according to claim 11, wherein the reference current has a mean value between current that flows through the first magnetoresistive effect element of the low resistance state and current that flows through the first magnetoresistive effect element of the high resistance state.

17. The memory according to claim 11, wherein the current circuit comprises:
a fourth MOSFET having a first end connected to the first end of the third MOSFET;
a fifth MOSFET having a gate terminal connected to a gate terminal of the fourth MOSFET and to its own first end;
a sixth MOSFET having a first end connected to the first end of the fifth MOSFET and receiving the first potential at a gate terminal thereof;
a second resistance element connected to a second end of the sixth MOSFET and having substantially the same resistance as the first magnetoresistive effect element of the high resistance state;
a seventh MOSFET having a gate terminal connected to the gate terminal of the fourth MOSFET and to its own first end;
a eighth MOSFET having a first end connected to the first end of the seventh MOSFET and receiving the first potential at a gate terminal thereof; and
a third resistance element connected to a second end of the eighth MOSFET and having substantially the same resistance as the first magnetoresistive effect element of the low resistance state.

18. The memory according to claim 17, wherein
the first, second, and third resistance elements comprise a third, fourth, and fifth magnetoresistive effect elements, respectively,
the first, second, third, fourth, and fifth magnetoresistive effect elements have substantially the same characteristic,
the second and third magnetoresistive effect elements are fixed to the same resistance state,
the fourth magnetoresistive effect element is fixed to a high resistance state, and
the fifth magnetoresistive effect element is fixed to a low resistance state.

19. The memory according to claim 11, wherein the current circuit comprises:
a fourth MOSFET having a first end connected to the first end of the third MOSFET;
a fifth MOSFET having a gate terminal connected to a gate terminal of the fourth MOSFET and to its own first end;

a sixth MOSFET having a first end connected to the first end of the fifth MOSFET and receiving the first potential at a gate terminal thereof;

a second resistance element and a third resistance element that are serially connected and have substantially the same resistance as the first magnetoresistive effect element of the high resistance state, a first end of the serially-connected structure of the second and third resistance elements being connected to a second end of the sixth MOSFET; and a fourth resistance element and a fifth resistance element that are serially connected and have substantially the same resistance as the first magnetoresistive effect element of the low resistance state, the serially-connected structure of the fourth and fifth resistance elements being connected in parallel with the serially-connected structure of the second and third resistance elements.

20. The memory according to claim 19, wherein the first, second, third, fourth, and fifth resistance elements comprise a third, fourth, fifth, sixth, and seventh magnetoresistive effect elements, respectively, the first, second, third, fourth, fifth, sixth, and seventh magnetoresistive effect elements have substantially the same characteristic, the second and third magnetoresistive effect elements are fixed to the same resistance state, the fourth and fifth magnetoresistive effect elements are fixed to a high resistance state, and the sixth and seventh magnetoresistive effect elements are fixed to a low resistance state.

* * * * *